United States Patent
Yeo et al.

(10) Patent No.: US 8,048,761 B2
(45) Date of Patent: Nov. 1, 2011

(54) FABRICATING METHOD FOR CRACK STOP STRUCTURE ENHANCEMENT OF INTEGRATED CIRCUIT SEAL RING

(75) Inventors: Alfred Yeo, Singapore (SG); Kai Chong Chan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 81 days.

(21) Appl. No.: 12/378,513

(22) Filed: Feb. 17, 2009

(65) Prior Publication Data

US 2010/0207237 A1    Aug. 19, 2010

(51) Int. Cl.
H01L 21/762 (2006.01)
H01L 23/00 (2006.01)

(52) U.S. Cl. ........ 438/424; 438/462; 438/469; 438/430; 257/508; 257/E21.546; 257/E23.002

(58) Field of Classification Search .................. 438/74, 438/401, 462, 424, 612–645; 257/62, E23.194, 257/508, E21.546, E23.002
See application file for complete search history.

(56) References Cited

U.S. PATENT DOCUMENTS

| | | | |
|---|---|---|---|
| 6,495,918 B1 * | 12/2002 | Brintzinger | 257/758 |
| 7,256,475 B2 * | 8/2007 | Jao et al. | 257/622 |
| 2005/0098893 A1 * | 5/2005 | Tsutsue et al. | 257/758 |
| 2005/0196938 A1 * | 9/2005 | Tan et al. | 438/460 |
| 2008/0122038 A1 * | 5/2008 | Inohara | 257/620 |
| 2008/0160716 A1 * | 7/2008 | Seo et al. | 438/425 |
| 2008/0290446 A1 * | 11/2008 | Shin et al. | 257/510 |
| 2009/0302427 A1 * | 12/2009 | Su et al. | 257/620 |
| 2010/0038789 A1 * | 2/2010 | Cheng et al. | 257/753 |

* cited by examiner

Primary Examiner — Matthew Smith
Assistant Examiner — Walter H Swanson
(74) Attorney, Agent, or Firm — Robert D. McCutcheon

(57) ABSTRACT

An improved crack stop structure (and method of forming) is provided within a die seal ring of an integrated circuit die to increase crack resistance during the dicing of a semiconductor wafer. The crack stop structure includes a stack layer (of alternating insulating and conductive layers) and an anchor system extending from the stack layer to a predetermined point below the surface of the substrate. A crack stop trench is formed in the substrate and filled with material having good crack resistance to anchor the stack layer to the substrate.

20 Claims, 7 Drawing Sheets

FABRICATING METHOD FOR CRACK STOP STRUCTURE ENHANCEMENT OF INTEGRATED CIRCUIT SEAL RING

TECHNICAL FIELD

The present disclosure relates generally to semiconductor devices and fabrication methods, and more particularly to a die seal ring structure for semiconductor integrated circuits and fabrication thereof.

BACKGROUND

Both U.S. Pat. No. 6,300,223 to Chang, et al. and United States Patent Application Publication 2006/0264035 to Nogami provide general descriptions of die seal ring structures and each proposes a different approach to reduce stress induced during the wafer dicing (cutting) process. U.S. Pat. No. 6,300,223 to Chang, et al. and United States Patent Application Publication 2006/0264035 are incorporated herein by reference.

Due to shrinking dimensions for the devices fabricated on an integrated circuit, fabrication processes are now utilizing low or ultra low K dielectric material. Utilization of such dielectric material may affect reliability due to its inferior mechanical properties (e.g., low modulus, low strength, poor adhesion) as compared to conventional dielectrics (e.g., silicon dioxide). In addition, technology reduction with a decrease in saw street width (in order to obtain extra space to accommodate more transistors in the integrated circuit) may cause an increased risk of crack propagation into the stack layer or at the pre-metal dielectric and silicon substrate interface. Further, with 3D Through-Silicon Via (TSV) assembly technology emerging in the near future, dicing of stacked wafers (i.e., especially for the wafer backside), can potentially trigger cracking at the pre-metal dielectric and silicon substrate interface.

Now turning to FIG. 1, there is shown a cross-sectional view of a typical die seal ring structure 110 fabricated around the perimeter of the active area 120 (i.e., the integrated circuit) of a die 100 on a wafer. The die ring seal 110 includes a crack stop structure (CS) 130 designed to prevent crack propagation and a moisture oxidation barrier (MOB) 140 to reduce moisture ingression into the active die area during the dice process, package and assembly process, and environmental stress conditioning. As illustrated in FIG. 1, small buffer areas separate the CS 130 from a saw street region 150, the CS 130 from the MOB 140, and the MOB 140 from the active area 120. During wafer dicing, a substantial amount of stress (energy) is generated from the cutting action along the saw street. This stress is usually transferred laterally to the die seal ring region and may cause cracking in weak materials or material interfaces, and cracking may propagate into the active area. Cracking within the active area usually renders the integrated circuit defective.

In U.S. Pat. No. 6,300,223, a substrate trench (unfilled) is fabricated in a buffer space (i.e., the saw street region) adjacent a scribe line to reduce lateral stress during wafer cutting. This approach does not appear to address the crack propagation problem at the pre-metal dielectric and silicon substrate interface. In US Patent Application Publication No. 2006/0264035, a crack stop trench is formed and filled with material having high crack resistance. One problem with the fabrication method disclosed therein is the difficulty in etching the crack stop trench through four layers of material (two metal, one inter-level dielectric, and one dielectric). Moreover, the resulting interface between the crack stop trench fill material and the silicon substrate may not be strong enough to resist crack propagating at the interface.

Current crack stop structures, such as the CS 130 in FIG. 1, might adequately prevent crack propagation between different metal layers and dielectric material layers in the stack layer, but may not protect against cracking in a weak mechanical interface between the pre-metal dielectric layer (CA) and the silicon (semiconductor) substrate 160.

Therefore, there is a need for an improved crack stop structure (and method of fabricating) in the die seal ring surrounding the active area of a die on a wafer.

SUMMARY

In accordance with one embodiment, there is provided a method of fabricating a semiconductor device. The method includes forming a first insulating layer overlying a substrate having an active area in which one or more doped regions form at least a part of an active device within the active area. A via is formed in the in the insulating layer and a crack stop trench is formed in the substrate and filled with a first predetermined material to form at least a first portion of an anchor within the substrate. A stacked layer is formed overlying the first insulating layer, the stacked layer including at least a first conductive layer and a second insulating layer overlying the first conductive layer.

In accordance with another embodiment, there is provided a semiconductor device having a crack stop structure adjacent an active area. The crack stop structure includes a stacked layer having a plurality of alternating insulating layers and conductive layers; and an anchor system including at least one anchor having a first portion embedded within a substrate of the semiconductor die and having a second portion coupled to a one of the conductive layers for attaching the stacked layer to the substrate.

In yet another embodiment, there is provided a semiconductor wafer including a substrate and a plurality of integrated circuit dies. Each integrated circuit die includes a die seal ring adjacent an active area. The die seal ring includes a crack stop structure having a stack layer overlying the substrate and an anchor system coupled to the stack layer and extending from the stack layer to a point below a surface of the substrate.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
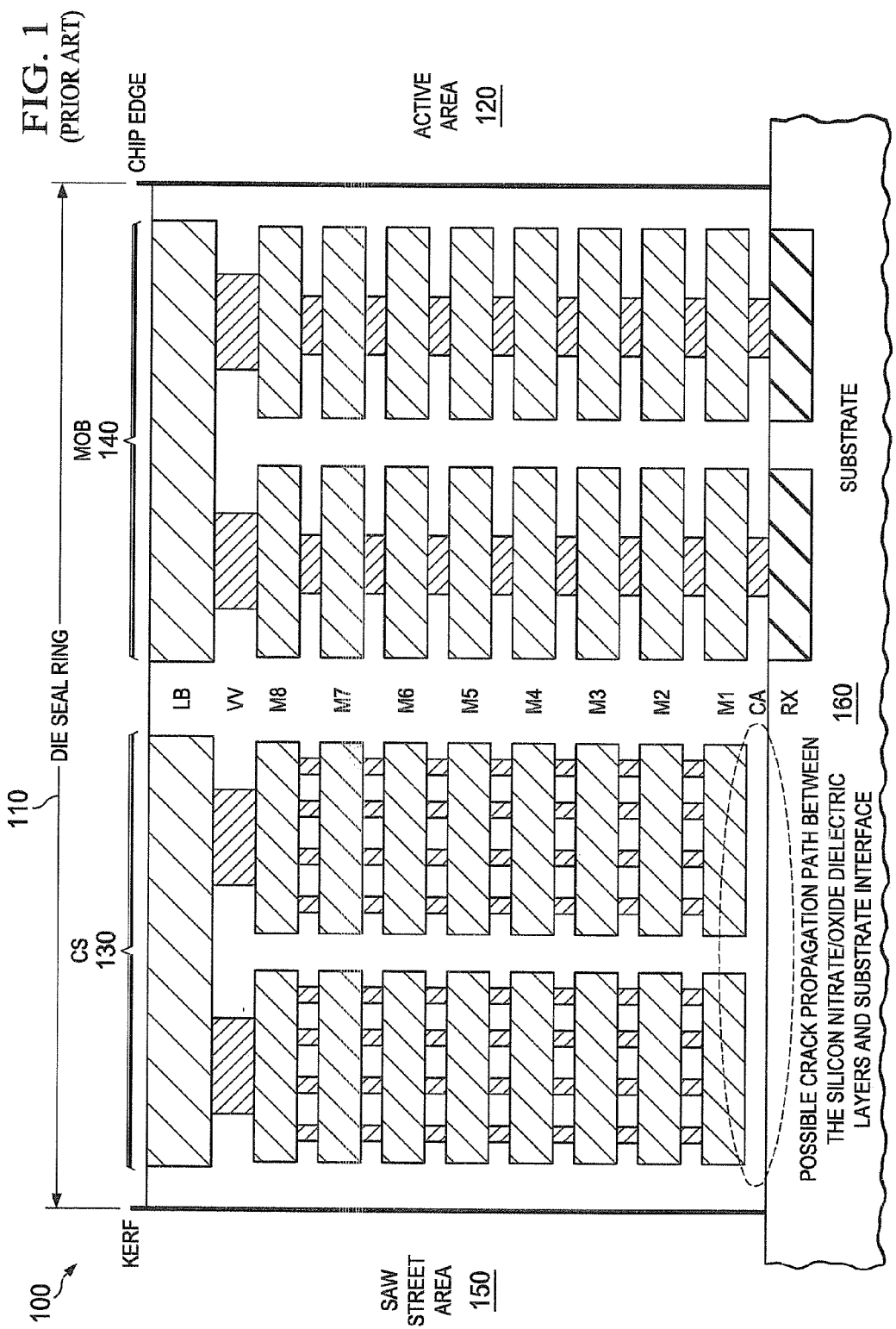
FIG. 1 is a cross-sectional view of a typical prior art die seal ring.
Figure 2:
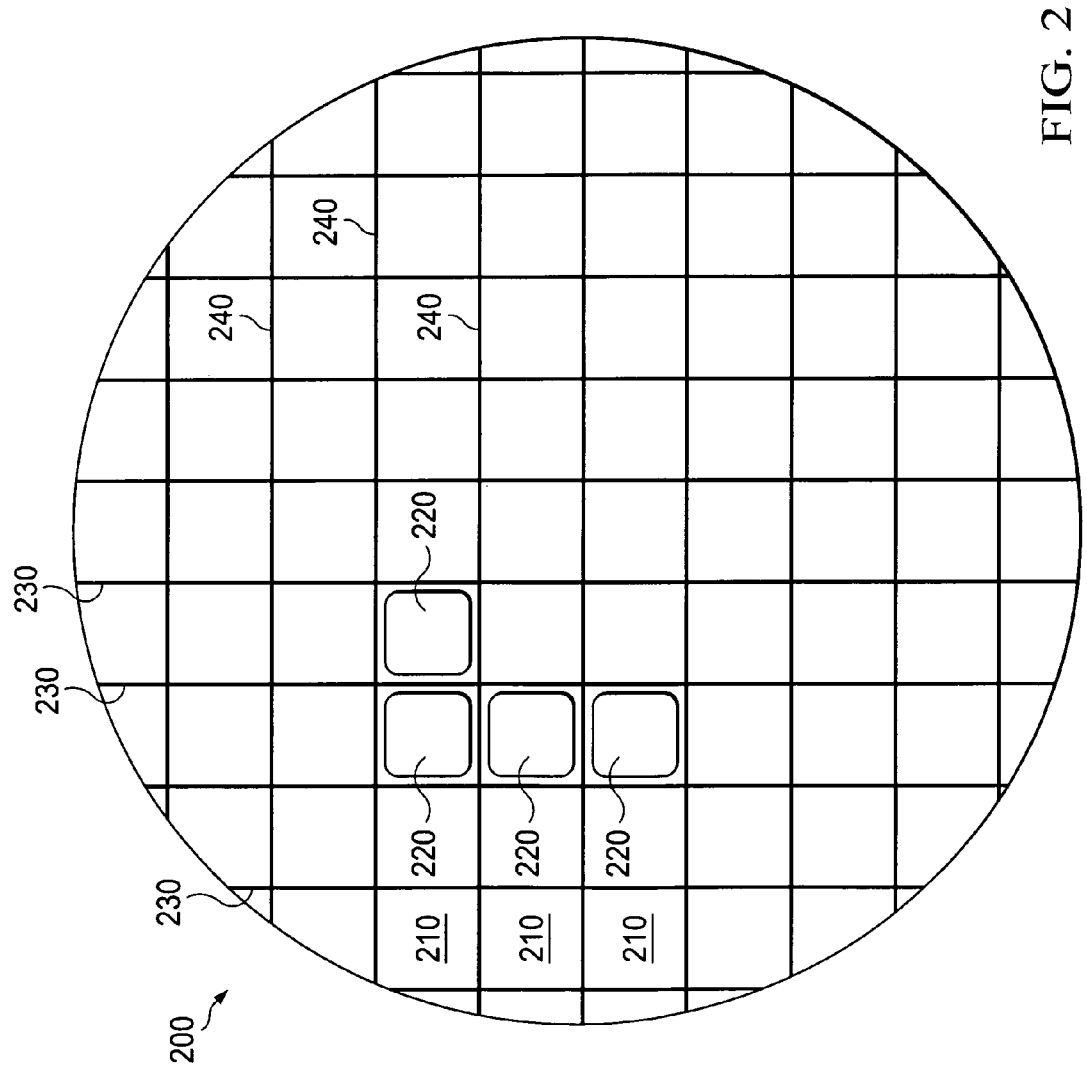
FIG. 2 illustrates a semiconductor wafer having multiple dies.

Referring to FIG. 2, there is shown a plan view of a semiconductor wafer 200 in accordance with the present disclosure. The wafer 200 includes multiple dies 210, with each individual die 210 having a distinct integrated circuit or active area 220 formed thereon. The dies 210 are separated along scribe lines (or saw street areas) 230, 240 by sawing or cutting using a mechanical process or by a non-contact process such as with a laser. A die seal ring structure 250 (including a crack stop structure (CS)—not shown in FIG. 2) is formed around the periphery of the active area 220 of each die 210 to prevent or reduce the likelihood of cracking in the die 210 during the separation process.

Figure 3A:
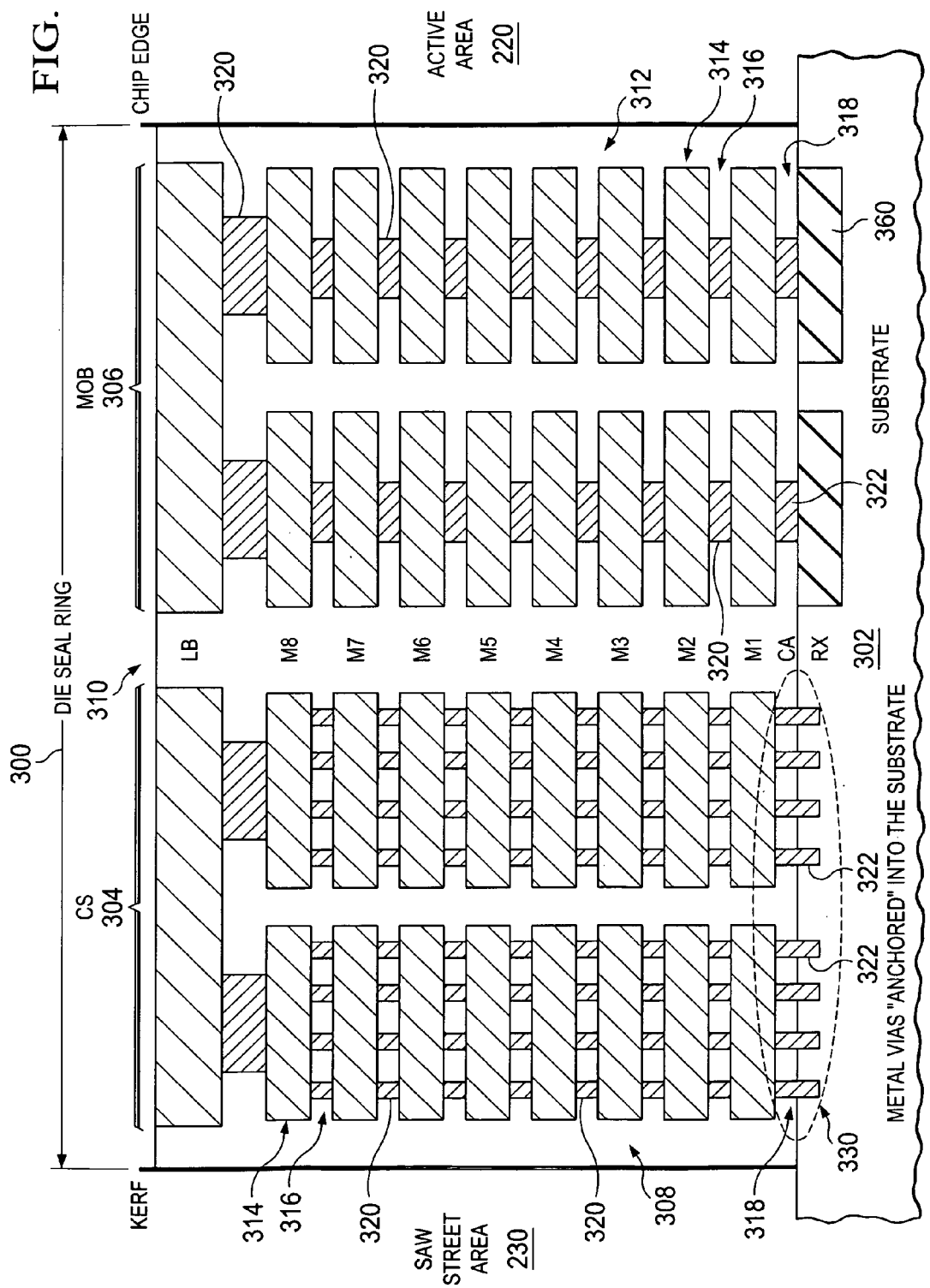
FIG. 3A is a cross-sectional view of one embodiment of a die seal ring structure in accordance with the present disclosure.

Now referring to FIG. 3A, there is shown a cross-sectional view illustrating one embodiment of a die seal ring structure 300. The die seal ring 300 includes a crack stop structure (CS) 304 laterally adjacent a moisture oxidation barrier (MOB) 306. Small buffer areas 308, 310, 312 separate laterally the saw street area 230, the CS 304, the MOB 306, and the active area 220, respectively.

The CS 304 includes a plurality of stacked alternating metal layers 314 and dielectric layers 316 overlying a substrate 302. The CS 304 also includes a pre-metal dielectric layer 318 disposed between the substrate 302 and the first metal layer (M1) 314. The dielectric layers 316 disposed between two successive metal layers 314 are referred to as inter-level dielectric (ILD) layers. Though nine metal layers 314 are shown (M1-M8 and LB (metallization pad)) with eight dielectric layers 316 shown disposed therebetween, the CS structure 304 may include any number of metal layers 314 and dielectric layers 316 disposed therebetween, as desired for a particular process or application.

Extending between each adjacent pair of metal layers 314 is one or more vias 320. The vias 320 are formed in the dielectric layers 316 positioned between each respective pair of metal layers 314 and filled with metal. Extending between the first metal layer 314 and into (below the surface of) the substrate 302 are one or more vias 322. The vias 322 are formed in the pre-metal dielectric layer 318 and filled with metal (or other conductive material). Any suitable number of vias 320 and 322 may be used.

The ILD layers 316 and the pre-metal dielectric layer 318 may be formed of one or more insulating materials. By way of example, and without limiting the types of insulating materials that may be used, the dielectric layers may be an oxide, an organo-silicate glass, organic or inorganic, low-k dielectric constant material (k<4) or ultra low-k dielectric constant material (k<2.5), or may be formed of any other suitable dielectric material(s). This material may be porous or non-porous. The same or different dielectric materials may be used for the dielectric layers 316, 318. The metal layers 314 and the metal vias 320 and 322 may be formed of copper, tungsten, aluminum, silver, gold, other metals, or alloys thereof. The same or different metals may be used for the metal layers 314 and the vias 320, 322. Copper is used in one embodiment because of its low resistance.

The substrate 302 may be, for example, a silicon substrate, silicon on insulator (SOI) substrate, gallium arsenic substrate, silicon germanium substrate, ceramic substrate, quartz substrate, glass substrate for a display, or any other suitable semiconductor substrate materials, now known or later developed. In one embodiment, the substrate 302 includes silicon (e.g., n-type, p-type, or no type) provided in a single well or twin-well process, and may further include an epitaxial layer. Active (having one or more doped/implant region(s)) and passive devices may be formed on (or in) the substrate 302.

As shown, the overall CS structure 304 includes metal lines/layers 314 structurally and electrically connected to each other through the metal vias 320 formed in the dielectric layers 316. Different configurations of alternating metal and dielectric stack layers, and different materials, other than that shown in or described with respect to FIG. 3A, may be used if suitable for the CS structure 304. In one embodiment, the CS structure 304 is continuous and surrounds the active area 220 of the die 210.

The CS structure 304 of the present disclosure includes an anchoring system 330 (comprised of the vias 322) for anchoring, adhering or interfacing the first metal layer/line (M1) 314 with the substrate 302. In the embodiment shown in FIG. 3A, the one or more metal vias 322 are formed in the pre-metal dielectric layer 318 and extend between the first metal layer (M1) 314 through the pre-metal dielectric layer 318. This structure functionally "anchors" or attaches the CS structure 304 into or to the substrate 302. Additional details describing a process for forming the anchoring system 330 are described further below.

Similar in materials and structure to the CS structure 304 is the MOB structure 306 adjacent thereto. The MOB structure 306 includes the same plurality of stacked alternating metal layers 314 and dielectric layers 316 overlying the substrate 302, and also includes the pre-metal dielectric layer 318 disposed between the substrate 302 and the first metal layer 314. A different number of metal and dielectric layers 314, 316 may be utilized to form the MOB structure 306. Other configurations are possible. Further, the size and number of the metal vias 320, 322 in the MBO structure 306 may be the same as or different from those in the CS structure 304. Similarly, MOB structure 306 may include any number of metal layers 314 and dielectric layers 316 disposed therebetween, as desired for a particular process or application.

The substrate 302 further includes a doped region (e.g., P+) 360. This doped region 360 interfaces with both the pre-metal dielectric layer 318 and the vias 322 and provides a low resistance path (for grounding purposes) in the seal ring in the event of any surge currents (e.g., electrostatic discharge) and ionic contaminants.

Figure 4A:
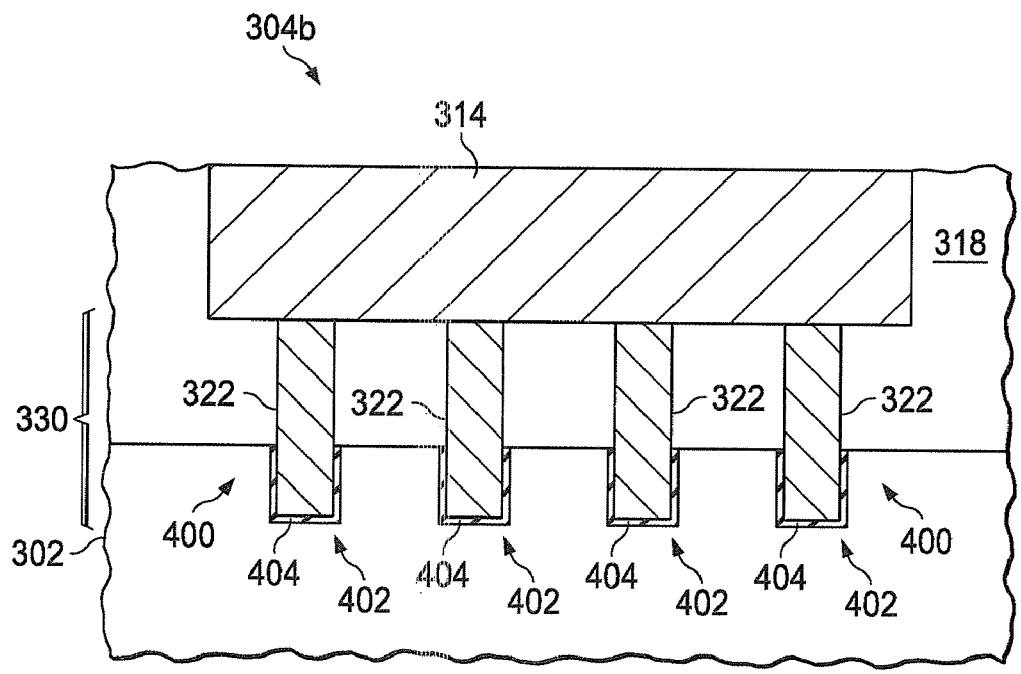
FIG. 4A is a close-up and more detailed cross-sectional view of the interface between the guard seal ring structure shown in FIG. 2 and the semiconductor substrate.

Now turning to FIG. 4A, there is shown a close-up and more detailed cross-sectional view of the interface between the CS structure 304 (within the die seal ring 300) shown in FIG. 3A and the semiconductor substrate 302.

The anchoring system 330 includes four anchors 400 extending through the pre-metal dielectric layer 318 between the first metal layer (M1) 314 and into the substrate 302 to a predetermined depth below the substrate's surface. One end of the anchors 400 contact the first metal layer (M1) 314 and the other end is embedded in the substrate 302. A portion of the anchors 400 is formed within trenches 402 in the substrate 302 that are aligned with the unfilled vias 322 through the pre-metal dielectric layer 318. The trenches 402 are formed within the substrate 302 on substantially the same layer level (RX layer) as the doping regions formed for the active devices formed within the active area 220.

To form the anchors 400, the vias 322 and trenches 402 are filled with metal or a dielectric material, such as carbon polymer dielectric, that is resistant to cracking. Other materials may be used to fill the trenches 402 and the vias 322.

Metals that may be used include copper, tungsten, aluminum, silver, gold, other metals, or alloys thereof. The same or different metals may be used in the vias 322 and the trenches 402. In one embodiment, tungsten is used and formed simultaneously with the CA layer process.

Prior to filling the trenches 402, an isolation wall/layer (or adhesion wall/layer) 404 is formed on the surfaces (sides and bottom) of the trenches 402. In one embodiment, the isolation wall is a dielectric material, such as silicon nitride or silicon oxide. Other dielectrics or materials may be used to form the isolation walls 404, and may include a diffusion barrier.

Figure 3B:
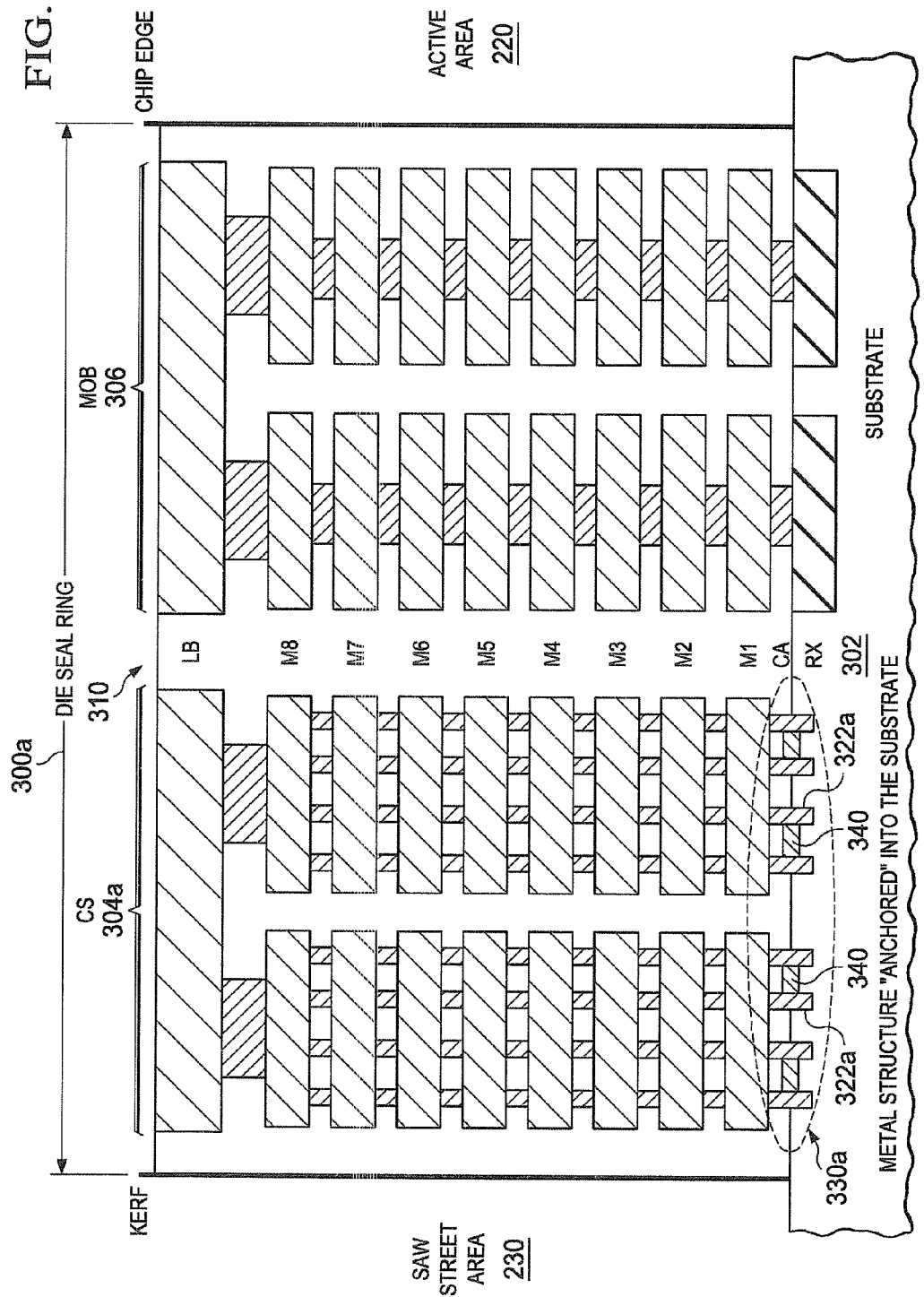
FIG. 3B is a cross-sectional view of another embodiment of a die seal ring structure in accordance with the present disclosure.

Now referring to FIG. 3B, there is shown a cross-sectional view illustrating another embodiment of a die seal ring structure 300a. The die seal ring 300a includes a crack stop structure (CS) 304a laterally adjacent the moisture oxidation barrier (MOB) 306.

The CS 304a further includes the same or similar plurality of stacked alternating metal layers 314 and dielectric layers 316, pre-metal dielectric layer 318 and the vias 320, as that shown in the CS 304 of FIG. 3A. Extending between the first metal layer 314 and into (below the surface of) the substrate 302 is one or more vias 322a. The vias 322a are formed in the pre-metal dielectric layer 318 and filled with metal. Any suitable number of vias 322a may be used. Laterally disposed between the vias 322a is a layer 340 disposed on the surface of substrate 302 and extending from one via 322a to the other via 322a. Thus, the layer 340 connects the vias 322a together at and above the surface of the substrate 302.

The CS structure 304a of the present disclosure includes an anchoring system 330a (filled vias 322a and layer 340) for anchoring, adhering or interfacing the first metal layer/line (M1) 314 with the substrate 302. In the embodiment shown in FIG. 3B, the one or more metal vias 322a are formed in the pre-metal dielectric layer 318 and extend between the first metal layer (M1) 314 and the pre-metal dielectric layer 318. This structure functionally "anchors" or attaches the CS structure 304a into or to the substrate 302.

The MOB 306 structure may the same or similar to the MOB structure shown in FIG. 3A.

Figure 4B:
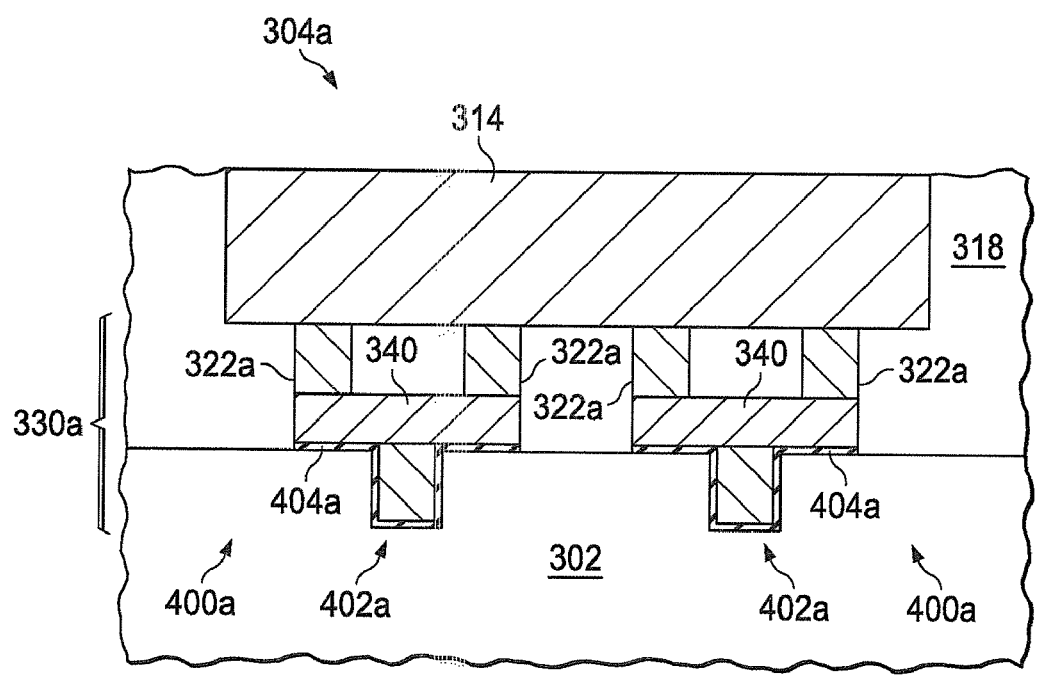
FIG. 4B is a close-up and more detailed cross-sectional view of the interface between the guard seal ring structure shown in FIG. 2B and the semiconductor substrate.

Now turning to FIG. 4B, there is shown a close-up and more detailed cross-sectional view of the interface between the CS structure 304a (within the die seal ring 300a) shown in FIG. 3B and the semiconductor substrate 302.

The anchoring system 330a includes two anchors 400a extending through the pre-metal dielectric layer 318 between the first metal layer (M1) 314 and into the substrate 302 to a predetermined depth below the substrate's surface. One end of the anchors 400a contact the first metal layer (M1) 314 and the other end is embedded in the substrate 302. A portion of the anchors 400a is formed within trenches 402a in the substrate 302 that are not necessarily aligned with the unfilled vias 322a through the pre-metal dielectric layer 318. The layer 340 is also is formed within the pre-metal dielectric layer 318, contacts the surface of the substrate 302, and extends between the vias 322a, as shown.

To form the anchors 400a, the vias 322a, and trenches 402a are filled with metal or a dielectric material, such as carbon polymer dielectric, that is resistant to cracking. The layer is formed of the same of similar materials. Other materials may be used to fill the trenches 402a, the vias 322a and form the layer 340. Metals that may be used include copper, tungsten, aluminum, silver, gold, other metals, or alloys thereof. The same or different metals may be used in the vias 322a, trenches 402a and the layer 340. In one embodiment, tungsten is used and formed simultaneously with the CA layer process.

Now referring to FIGS. 5A through 5F, there are shown cross-sectional views of a process in accordance with this disclosure. With specific reference to FIG. 5A, there is shown a relevant portion of an initial die 210 including the substrate 302 having the pre-metal dielectric layer 318 formed thereon. The layer 318 may be formed using any conventional process, such as a chemical vapor deposition (CVD) process or high density plasma (HDP) process, and the dielectric material may be a single layer of silicon nitride (SiN) or silicon dioxide ($SiO_2$), or other material, or include multiple layers of dielectric materials (e.g., SiN and $SiO_2$). Other suitable dielectric material(s) may be used.

Figure 5A:
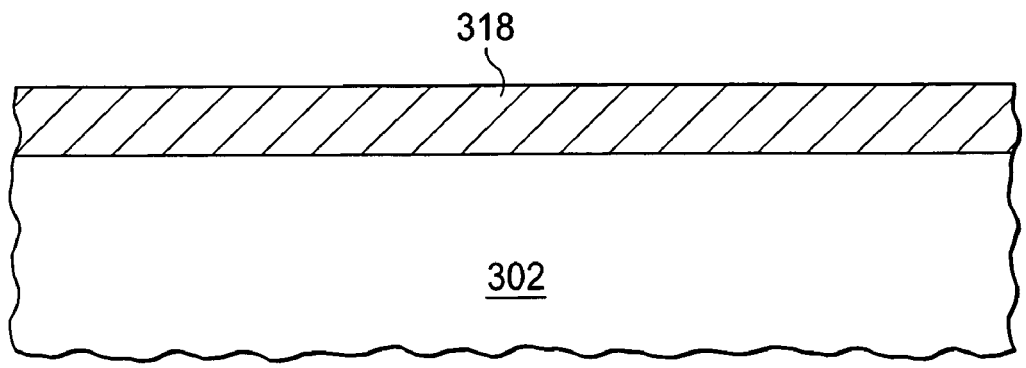
FIGS. 5A-5F are cross-sectional views illustrating various steps of a method or process in accordance with the present disclosure.
Figure 5B:
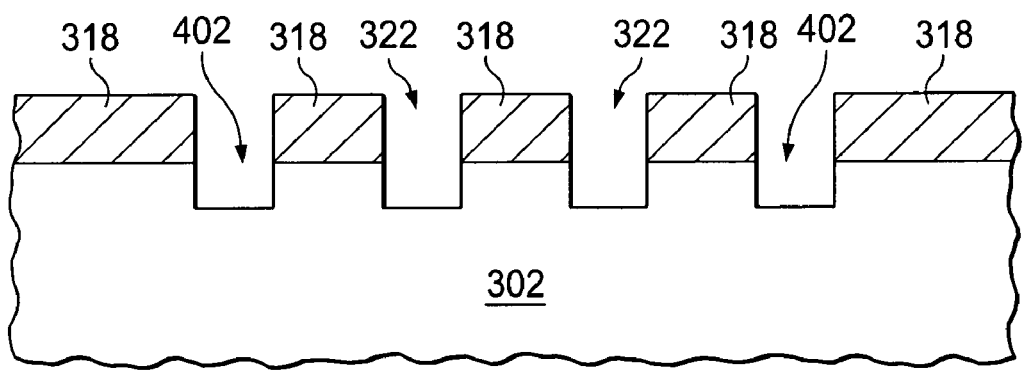

Referring to FIG. 5B, a next step in the process includes selectively etching/removing the dielectric layer 318 and a portion of the substrate 302 to create the vias 322 and the trenches 402. Any conventional masking or removal process may be utilized.

The depth of the trenches 402 (and resulting anchors 400) into the substrate 302 may range from about 10 um to about 200 or 300 um. In one embodiment, the anchors extend into the substrate 302 about 100 um or less, and in another embodiment, about 50 um or less. A depth sufficient for effective anchoring and good crack resistance should be formed. A relatively deep trench/via with high aspect ratio may pose process difficulties, such as incomplete or non-conformal metal fill, voids, or seam voids.

Figure 5C:
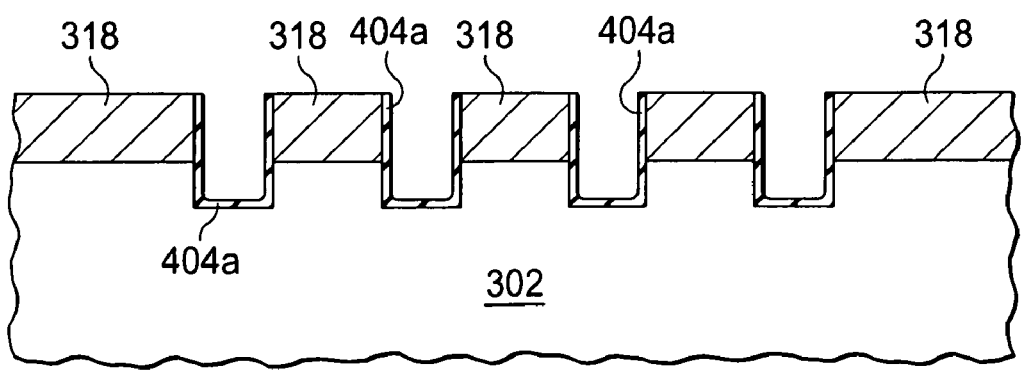
Figure 5D:
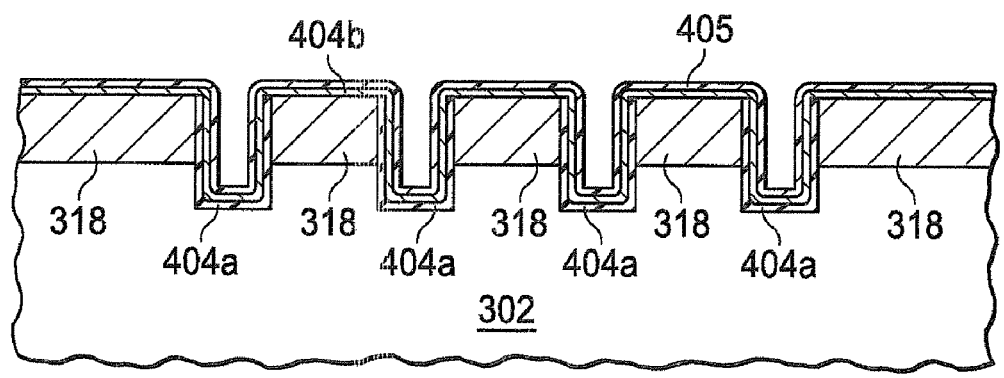

Referring now to FIG. 5C, an insulating layer 404a is formed on the sidewalls of the vias 322 and trenches 402 and on the bottom surface of the trenches 402. This layer 404a forms part of the isolation wall/layer 404. In one embodiment, the insulating layer 404a is an oxide layer grown in a thermal oxidation process. Other processes may be employed to form or deposit the insulating layer 404a and other materials may be used. Layer 404a may be any suitable thickness, and typically a few hundred to a thousand Angstroms. After forming insulating layer 404a, a barrier layer 404b is formed over the insulation layer 404b, as shown in FIG. 5D. In one embodiment, the barrier layer 404b is a layer of deposited Tantalum nitride (TiN). This forms a barrier between the silicon substrate 302 and the anchors 400 (yet to be formed) and between the pre-metal dielectric layer 318 and anchors 400. Other processes may be employed to form or deposit the barrier layer 404b and other materials may be used. Layer 404b may be any suitable thickness, and typically a few hundred Angstroms. It will be understood that the insulating layer 404a and the barrier layer 404b together may form the isolation wall/layer 404. In another embodiment, a copper (Cu) seed layer 405 is formed on the isolation layer/wall 404 and within the vias 322 and the trenches 402. This may be accomplished by forming (e.g., sputtering) a seed layer over the entire substrate.

Figure 5E:
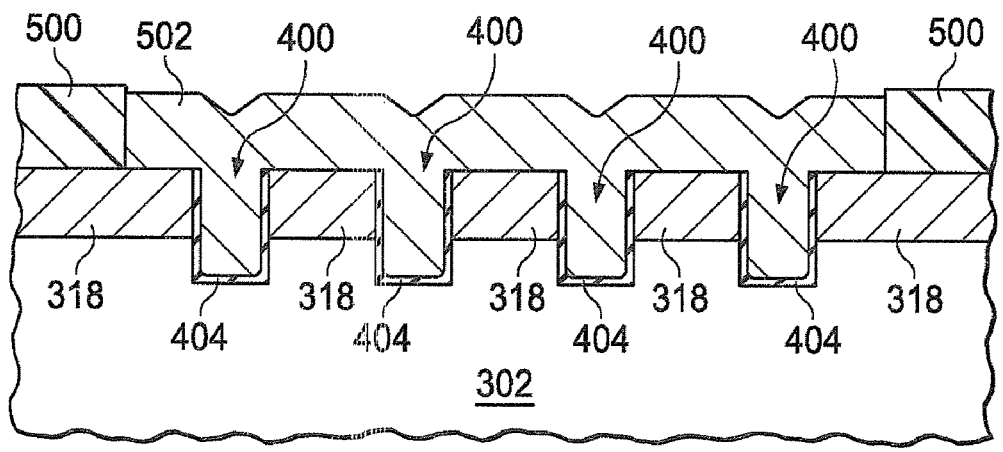
Figure 5F:
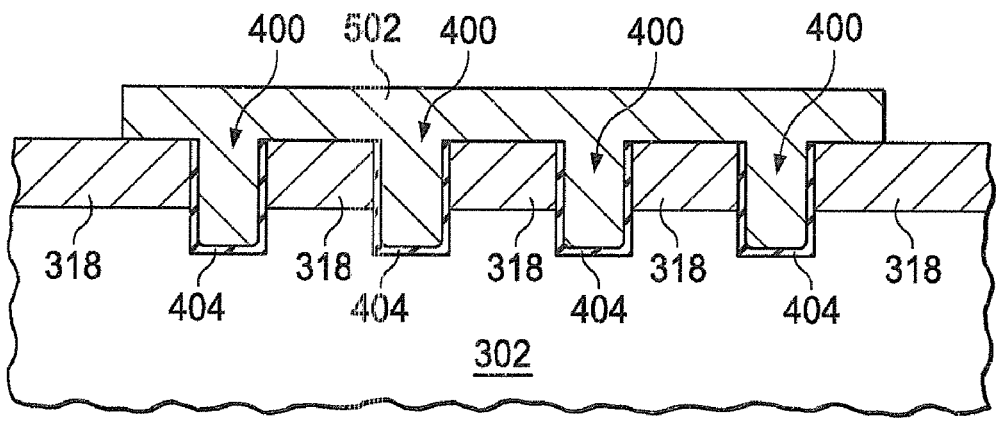

Referring now to FIG. 5E, a patterned mask 500 is applied, and Cu layer 502 is formed at the defined topology with an electroplating Cu process to fill the vias 322 and trenches 402 (and form the anchors 400). It will be understood that other metals and other materials having substantial crack resistance and good adhesion may be deposited to form the anchors 400. After the vias 322 and trenches 402 are filled with material, the mask 500 is removed and the remaining exposed Cu seed layer is removed, as shown in FIG. 5F. The remaining current structure is planarized to the original pre-metal dielectric layer 318 with the anchors 400 therein. This also removes any remaining isolation wall/layer 404 on the upper surface of the pre-metal dielectric layer 318. Planarization may be accomplished using a chemical-mechanical polishing (CMP) process.

At this point in the process, the remaining alternating dielectric layers 316 and metal layers 314 (stack layer) and the vias 220 above the first metal layer (M1) 314 are formed using conventional processes.

The methods and structures described herein do not form a complete process for manufacturing semiconductor device structures. The remainder of the process is known to those of ordinary skill in the art and, therefore, only the process steps and structures necessary to understand the present disclosure have been described herein.

The methods and the crack stop (CS) structures of the present disclosure may be applied to any microelectronic devices, such as integrated circuit semiconductor devices, processors, micro-electromechanical (MEM) devices, opto-electronic devices, and display devices.

Further, the structures and regions shown in the FIGURES are not drawn to scale or actual form, and are for illustrative purposes. It is also understood that the dies 210 and their active area structures may be formed using conventional processes.

It may be possible that the order of steps or processing can be changed or varied from that described above. It will be understood that well known process(es) have not been described in detail and have been omitted for brevity. Although specific steps, insulating materials, conductive materials and apparatuses for depositing and etching these materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of fabricating a semiconductor device, the method comprising:
    forming a first insulating layer overlying a substrate, the substrate having an active area in which one or more doped regions form at least a part of an active device within the active area;
    forming a via in the first insulating layer;
    forming a crack stop trench in the substrate;
    after forming the via and the crack stop trench, filling the crack stop trench in the substrate with a first predetermined material to form at least a first portion of an anchor within the substrate; and
    after filling the crack stop trench, forming a stacked layer overlying the first insulating layer, the stacked layer including at least a first conductive layer and a second insulating layer overlying the first conductive layer.

2. The method in accordance with claim 1 further comprising:
    filling the via in the first insulating layer with a second predetermined material, wherein the first predetermined material and the second predetermined material together form the first portion of the anchor; and
    wherein the second predetermined material interconnects with the first conductive layer.

3. The method in accordance with claim 1 wherein the first predetermined material comprises metal.

4. The method in accordance with claim 2 wherein the first predetermined material comprises copper, the second predetermined material comprises copper and the first conductive layer comprises copper.

5. The method in accordance with claim 1 further comprising:
    prior to filling the crack stop trench, forming an isolation layer on a surface of the crack stop trench.

6. The method in accordance with claim 5 wherein forming the isolation layer further comprises:
    forming an isolation insulating layer; and
    forming a barrier layer over the isolation insulating layer.

7. The method in accordance with claim 6 wherein the isolation insulating layer comprises oxide and the barrier layer comprises nitride.

8. The method in accordance with claim 1 wherein the anchor anchors the stacked layer to a point below a surface of the substrate.

9. The method in accordance with claim 1 wherein the crack stop trench surrounds the active area of the substrate.

10. A method of fabricating a semiconductor device, the method comprising:
    forming a first insulating layer overlying a substrate, the substrate having an active area in which one or more doped regions form at least a part of an active device within the active area;
    forming a plurality of vias in the first insulating layer;
    forming a plurality of crack stop trenches in the substrate;
    after forming the plurality of vias and the plurality of crack stop trenches, filling the crack stop trenches in the substrate with material to form at least a portion of an anchor within the substrate; and
    forming a stacked layer overlying the first insulating layer, the stacked layer including at least a first conductive layer and a second insulating layer overlying the first conductive layer.

11. The method in accordance with claim 10 further comprising:
    filling the plurality of vias with material to form another portion of the anchor; and
    wherein the material within the plurality of crack stop trenches is metal and the material within the plurality of vias is metal.

12. The method in accordance with claim 10 wherein the anchor interconnects with the first conductive layer.

13. The method in accordance with claim 10 further comprising:
    prior to filling the plurality of crack stop trenches, forming an isolation layer on a surface of the crack stop trench.

14. The method in accordance with claim 13 wherein forming the isolation layer further comprises:
    forming an isolation insulating layer; and
    forming a barrier layer over the isolation insulating layer.

15. The method in accordance with claim 14 wherein the isolation insulating layer comprises oxide and the barrier layer comprises nitride.

16. The method in accordance with claim 10 wherein the anchor anchors the stacked layer to a point below a surface of the substrate.

17. The method in accordance with claim 10 wherein the plurality of crack stop trenches surround the active area of the substrate.

18. A method of fabricating a semiconductor device, the method comprising:
- forming a first insulating layer overlying a substrate, the substrate having an active area in which one or more doped regions form at least a part of an active device within the active area;
- selectively removing material from the first insulating layer to form a via extending through the first insulating layer to the substrate;
- selectively removing material from the substrate to form a trench in the substrate;
- forming a layer of first material on sidewalls of the via and on sidewalls and a bottom surface of the trench;
- after forming the layer of first material, filling the via and the trench with a second material to form an anchor extending into at least a portion of the substrate; and
- after filling the via and the trench, forming a stacked layer overlying the first insulating layer, the stacked layer including at least a first conductive layer and a second insulating layer overlying the first conductive layer.

19. The method in accordance with claim 18 wherein the layer of material is a barrier layer and the second material comprises metal.

20. The method in accordance with claim 19 wherein filling the via and the trench with metal further comprises:
- forming a copper seed layer on the layer of first material within the via and the trench; and
- filling the via and trench with copper using an electroplating process.

* * * * *